United States Patent
Frank et al.

(10) Patent No.: US 10,707,827 B2
(45) Date of Patent: Jul. 7, 2020

(54) WIDE-BAND WILKINSON DIVIDER

(71) Applicant: QUALCOMM Incorporated, San Diego, CA (US)

(72) Inventors: Wolfgang Frank, San Diego, CA (US); Qizhi Gong, San Diego, CA (US); Scott Walter, San Diego, CA (US); Sanat Kapoor, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/018,613

(22) Filed: Jun. 26, 2018

(65) Prior Publication Data

US 2019/0214962 A1    Jul. 11, 2019

Related U.S. Application Data

(60) Provisional application No. 62/614,666, filed on Jan. 8, 2018.

(51) Int. Cl.
*H03H 7/46* (2006.01)
*H04B 1/04* (2006.01)
*H01P 3/08* (2006.01)
*H04B 1/18* (2006.01)
*H01P 1/203* (2006.01)
*H01P 5/16* (2006.01)
(Continued)

(52) U.S. Cl.
CPC ............ *H03H 7/468* (2013.01); *H01P 1/203* (2013.01); *H01P 3/08* (2013.01); *H01P 5/16* (2013.01);
(Continued)

(58) Field of Classification Search
CPC ........ H03H 7/468; H03H 7/466; H05K 1/025; H05K 1/0243; H05K 2201/10098;
(Continued)

(56) References Cited

U.S. PATENT DOCUMENTS

| 6,054,906 A * | 4/2000 | Kim ..................... H04B 1/0458 333/124 |
| 2006/0099906 A1* | 5/2006 | Bae ........................ H04H 40/90 455/3.02 |

(Continued)

FOREIGN PATENT DOCUMENTS

| CN | 106876855 A | 6/2017 |
| CN | 107086345 A | 8/2017 |

(Continued)

OTHER PUBLICATIONS

Srivani V., "1-2.5GHz Multistage Wilkinson 2-way Power Divider for Checkout Applications," 2015 International Conference on Signal Processing and Communication Engineering Systems, Jan. 2015, pp. 176-178.

(Continued)

*Primary Examiner* — Eugene Yun
(74) *Attorney, Agent, or Firm* — Patterson & Sheridan, LLP (57) ABSTRACT

Certain aspects of the present disclosure provide a circuit for dividing or combining power. The circuit generally includes a Wilkinson power divider, a first capacitive element, and a first resistive element coupled in parallel with the first capacitive element, wherein the first capacitive element and the first resistive element are coupled between a first port of the circuit and a first port of the Wilkinson power divider.

21 Claims, 7 Drawing Sheets

(51) Int. Cl.
*H04B 1/40* (2015.01)
*H05K 1/02* (2006.01)
*H01Q 21/00* (2006.01)

(52) U.S. Cl.
CPC .......... *H03H 7/466* (2013.01); *H04B 1/0458* (2013.01); *H04B 1/18* (2013.01); *H04B 1/40* (2013.01); *H05K 1/025* (2013.01); *H05K 1/0243* (2013.01); *H01Q 21/00* (2013.01); *H05K 2201/093* (2013.01); *H05K 2201/10098* (2013.01)

(58) Field of Classification Search
CPC ....... H05K 2201/093; H04B 1/40; H01P 5/16; H01P 3/08; H01P 1/203
USPC .......................................................... 455/73
See application file for complete search history.

(56) References Cited

U.S. PATENT DOCUMENTS

| | | | | |
|---|---|---|---|---|
| 2008/0132193 A1* | 6/2008 | Petrovic | ................ | H04H 40/90 455/323 |
| 2010/0066631 A1* | 3/2010 | Puzella | ................... | H01Q 1/02 343/853 |
| 2011/0063048 A1 | 3/2011 | Floyd et al. | | |
| 2017/0069949 A1 | 3/2017 | Yoon | | |

FOREIGN PATENT DOCUMENTS

| | | |
|---|---|---|
| JP | H10233637 A | 9/1998 |
| JP | 2005260703 A | 9/2005 |
| KR | 100623517 B1 | 9/2006 |

OTHER PUBLICATIONS

Dimitra P., et al., "Reconfigurable Single/Multi-Band Filtering Power Divider Based on Quasi-Bandpass Sections", Sep. 1, 2016 (Sep. 1, 2016), IEEE Microwave and Wireless Components Letters, IEEE Service Center, New York, NY, US, XP011621759, ISSN: 1531-1309, pp. 684-686, [retrieved on Sep. 1, 2016].

Hansen John S., "Generating Higher Output Power Signals for Today's Test Applications", Autotestcon, 2009 IEEE, Piscataway, NJ, USA, Sep. 14, 2009 (Sep. 14, 2009), XP031560338, pp. 51-54, ISBN: 978-1-4244-4980-4.

International Search Report and Written Opinion—PCT/US2018/065210—ISA/EPO—dated Mar. 19, 2019.

\* cited by examiner

SELECTIVELY BYPASS A FIRST RESISTIVE ELEMENT, A FIRST TERMINAL OF THE FIRST RESISTIVE ELEMENT BEING COUPLED TO A FIRST PORT OF A CIRCUIT FOR DIVIDING OR COMBINING POWER AND A SECOND TERMINAL OF THE FIRST RESISTIVE ELEMENT BEING COUPLED TO A FIRST PORT OF A WILKINSON POWER DIVIDER

604

SELECTIVELY BYPASS A SECOND RESISTIVE ELEMENT, A FIRST TERMINAL OF THE SECOND RESISTIVE ELEMENT BEING COUPLED TO A SECOND PORT OF THE CIRCUIT AND A SECOND TERMINAL OF THE SECOND RESISTIVE ELEMENT BEING COUPLED TO A SECOND PORT OF THE WILKINSON POWER DIVIDER

606

SELECTIVELY BYPASS A THIRD RESISTIVE ELEMENT, A FIRST TERMINAL OF THE THIRD RESISTIVE ELEMENT BEING COUPLED TO A THIRD PORT OF THE CIRCUIT AND A SECOND TERMINAL OF THE THIRD RESISTIVE ELEMENT BEING COUPLED TO A THIRD PORT OF THE WILKINSON POWER DIVIDER

WIDE-BAND WILKINSON DIVIDER

CROSS-REFERENCE TO RELATED APPLICATIONS

This application claims benefit of U.S. Provisional Patent Application Ser. No. 62/614,666, filed Jan. 8, 2018, which is expressly incorporated herein by reference in its entirety.

TECHNICAL FIELD

Certain aspects of the present disclosure generally relate to electronic circuits and, more particularly, to a circuit dividing or combining radio-frequency (RF) power.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more circuits for combining or dividing power for reception or transmission.

SUMMARY

Certain aspects of the present disclosure generally relate to a circuit for dividing or combining radio-frequency (RF) power over a broad frequency range.

Certain aspects of the present disclosure provide a circuit for dividing or combining RF power. The circuit generally includes a Wilkinson power divider, a first capacitive element, and a first resistive element coupled in parallel with the first capacitive element, wherein the first capacitive element and the first resistive element are coupled between a first port of the circuit and a first port of the Wilkinson power divider.

Certain aspects of the present disclosure provide a circuit for dividing or combining RF power. The circuit generally includes a Wilkinson power divider, a first resistive element having a first terminal coupled to a first port of the circuit and a second terminal coupled to a first port of the Wilkinson power divider, and a first bypass path coupled between the first terminal and the second terminal of the first resistive element and configured to selectively bypass the first resistive element based on a frequency of a signal at a first node of the circuit.

Certain aspects of the present disclosure provide a method for dividing or combining RF power. The method generally includes selectively bypassing a first resistive element, a first terminal of the first resistive element being coupled to a first port of a circuit for dividing or combining power and a second terminal of the first resistive element being coupled to a first port of a Wilkinson power divider.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
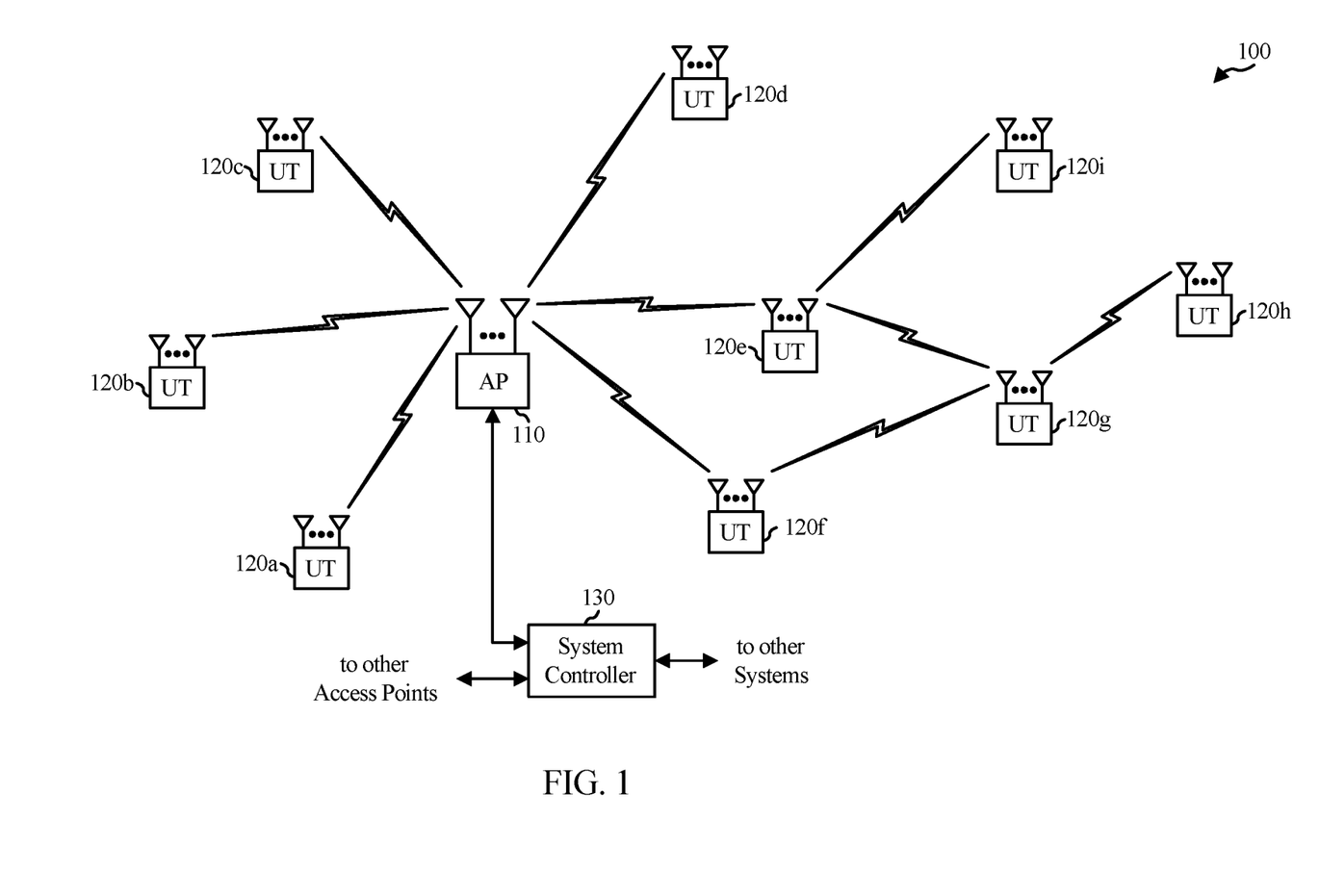
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a circuit for dividing or combining power, as described in more detail herein.

Figure 2:
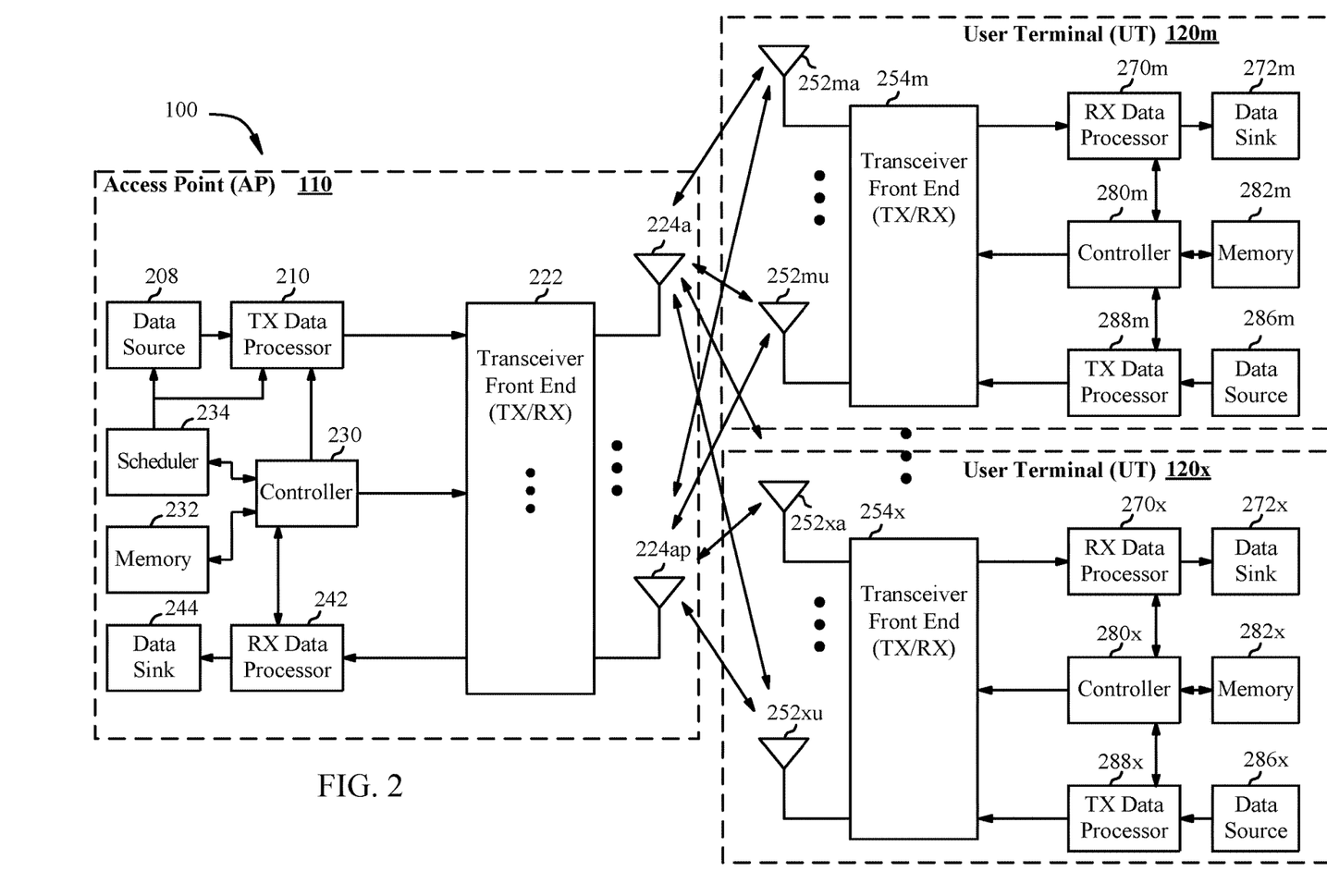
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of the data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a circuit for dividing or combining power, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
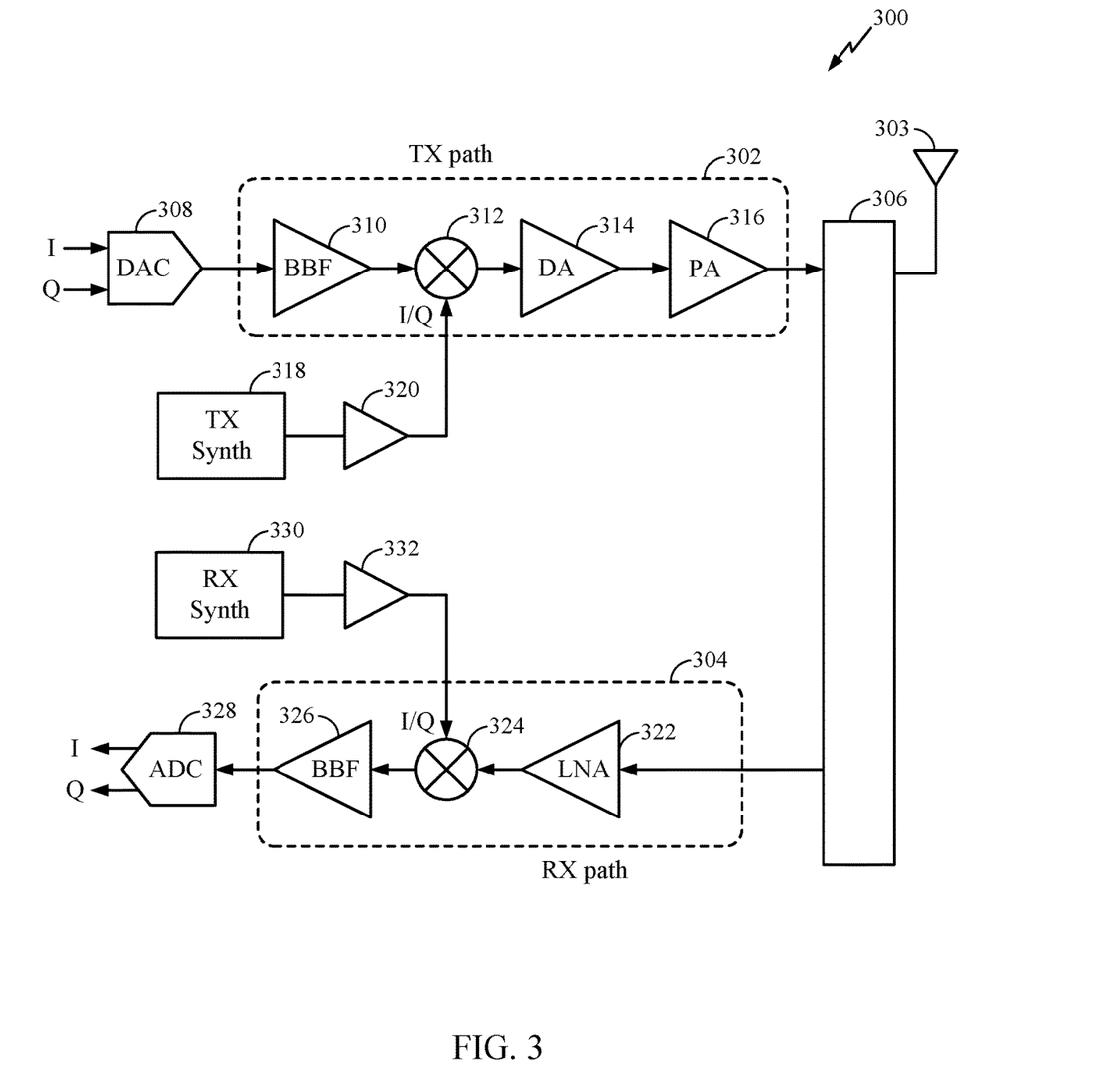
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like. In certain aspects, the interface 306 may include a circuit for dividing or combining power, as described in more detail herein. For example, the interface 306 may be coupled to multiple antennas and may include the circuit for dividing or combining power in order to divide a signal to be transmitted via the multiple antennas, or combine power of signals received via the multiple antennas.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. While FIGS. 1-3 provide a wireless communication system as an example application in which certain aspects of the present disclosure may be implemented to facilitate understanding, certain aspects provided herein can be applied to combine/divide power in any of various other suitable systems.

Example Circuit for Dividing and/or Combining Power

Modern communication transceivers are implemented with a wide bandwidth and at higher frequencies to achieve high data rates. An important part of the transceiver is the circuitry for combining and/or dividing broadband radio-frequency (RF) signals during reception or transmission. Low loss combining/dividing is desired for enhanced receive sensitivity and increased transmit power.

In certain aspects, a Wilkinson power divider, which has low insertion loss (e.g., about 3 dB) may be used for narrowband operations (e.g., at relatively high frequencies). For broadband signal dividing/combining, a resistive power divider may be used. The resistive power divider has higher insertion loss as compared to the Wilkinson power divider (e.g., about 6 dB). Certain aspects of the present disclosure provide circuitry that allows for a Wilkinson power divider to be used for broadband signals.

Figure 4:
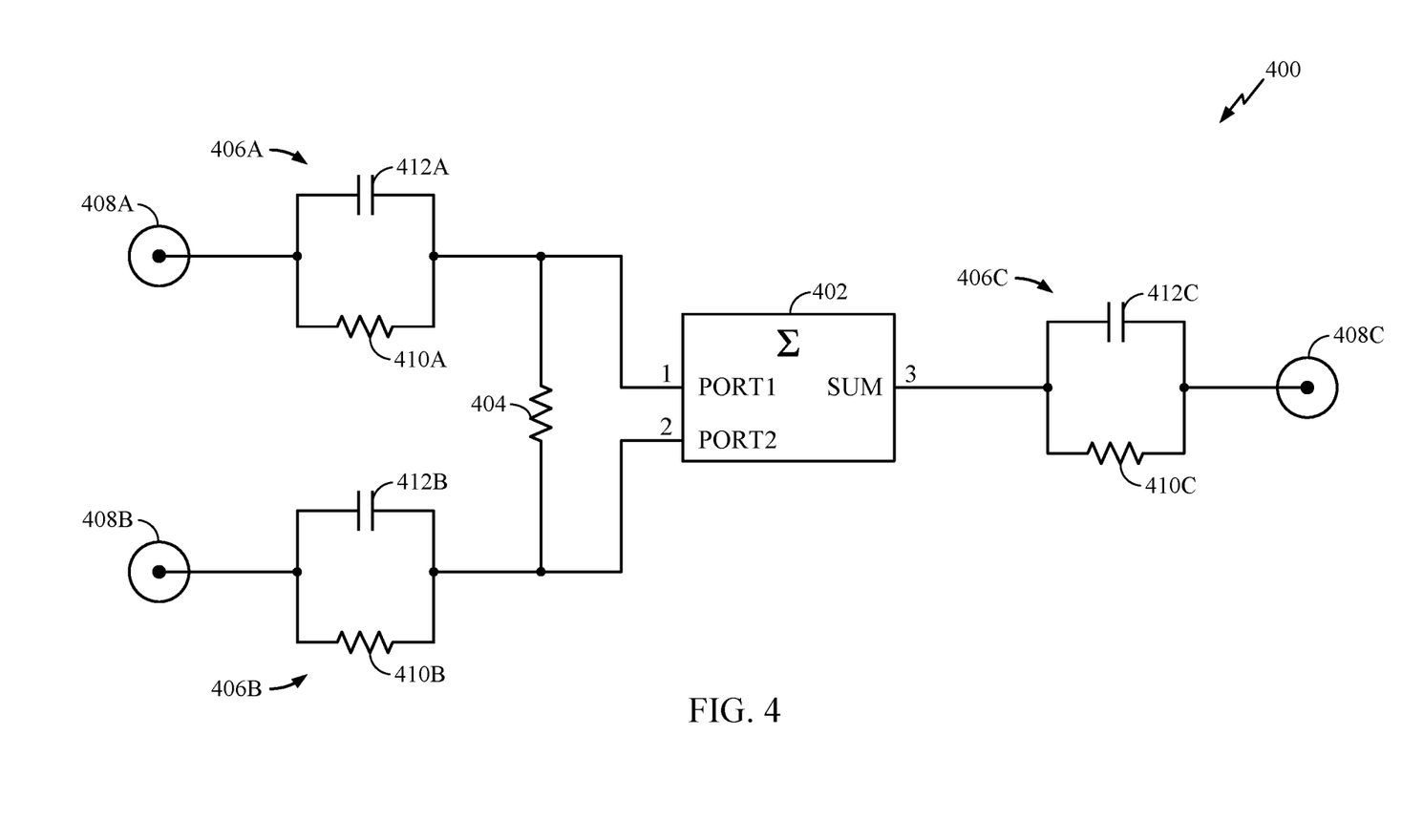
FIG. 4 illustrates a circuit for dividing or combining power, in accordance with certain aspects of the present disclosure.

FIG. 4 illustrates a circuit 400 for dividing or combining power, in accordance with certain aspects of the present disclosure. As illustrated, the circuit 400 includes a Wilkinson power divider 402 having three ports (labeled "1," "2," and "3") and an impedance 404 coupled between the first and second ports of the Wilkinson power divider 402. In certain aspects, the impedance 404 may be implemented as a resistive element. The impedance 404 enables the first and second ports (e.g., output ports) to be impedance matched and provides for isolation between the first and second ports. In some cases, the Wilkinson power divider 402 may be implemented using quarter wave transformers, which may include quarter wave lines or other forms of transmission lines, or lumped circuit elements (e.g., inductors or capacitors).

The Wilkinson power divider 402 is configured to operate to divide the power of a signal at the third port and generate signals at the first and second ports each having a portion of the power of the signal at the third port. For example, the Wilkinson power divider 402 may divide the power of a signal to generate two separate signals for transmission via separate antennas. In some cases, the Wilkinson power divider 402 may be used as a power combiner. For example, the Wilkinson power divider 402 is configured to combine the power of signals received at the first and second ports, and generate a signal at the third port having the combined powers of the signals at the first and second ports. That is, the Wilkinson power divider 402 combines the power of signals received from multiple antennas for processing by RF circuitry.

As presented above, a Wilkinson power divider may be used for narrowband operations at relatively high frequencies. A resistive divider may be used for broadband operations, but has higher insertion loss as compared to a Wilkinson power divider. Certain aspects of the present disclosure provide a circuit that is configurable to be operated as a Wilkinson power divider or a resistive power divider. For example, certain aspects provide resistive elements coupled to a Wilkinson power divider and a bypass path in parallel with each of the resistive elements. The bypass paths may be configured to selectively bypass the resistive elements, allowing the circuit to be dynamically configured as a resistive power divider for broadband operations or a Wilkinson power divider for narrowband operations. For example, the bypass path may operate differently according to the frequency content of a signal at a node of the circuit. For instance, when a frequency component of the signal is relatively high, the resistive elements may be bypassed, and current is routed through the bypass path, thus effectively configuring the circuit as a Wilkinson power divider for that frequency component. Alternatively, when a frequency component of the signal is relatively low, the resistive elements are not bypassed, thereby effectively configuring the circuit as a resistive power divider for that frequency component.

In certain aspects, the bypass path may be implemented using a capacitive element, as illustrated in FIG. 4. For example, the circuit 400 includes resistive-capacitive (RC) circuits that allow for the Wilkinson power divider to be used in broadband operations. For example, RC circuits 406A, 406B, and 406C (collectively referred to as "RC circuits 406") may be coupled to the first, second, and third ports, respectively, of the Wilkinson power divider, as illustrated. Each of the RC circuits 406 includes a resistive element 410A, 410B, or 410C (collectively referred to as "resistive elements 410"), and includes a bypass path having a capacitive element 412A, 412B, or 412C (collectively referred to as "capacitive elements 412"). In certain aspects, for example, each of the capacitive elements 412 of the RC circuits 406A and 406B may have a capacitance of 10 pF, and the capacitive element 412C of the RC circuit 406C may have a capacitance of 1 pF.

The capacitive elements 412 act as a high-pass filter and block (or at least attenuate) relatively low-frequency signals while passing relatively high-frequency signals (e.g., greater than 8.4 GHz). Thus, the capacitive elements 412 of the RC circuits 406 have high impedance (e.g., limit current flow by substantially behaving as an open circuit) with respect to relatively low-frequency signals (e.g., less than 1.5 GHz), and therefore, relatively low-frequency components of the signals received at ports 408A and 408B (or received at port 408C) pass through the resistive elements of the RC circuits 406. Moreover, the capacitive elements 412 of the RC circuits 406 have relatively low-impedance (e.g., allow current flow by substantially behaving as a short circuit) with respect to high-frequency signals, and therefore, relatively high-frequency components of the signals received at ports 408A and 408B (or received at port 408C) pass through the capacitive elements of the RC circuits 406. In other words, the capacitive elements 412 bypass the resistive elements 410 with respect to relatively high-frequency components of the signals received at ports 408A and 408B (or received at port 408C).

In this manner, the circuit 400 operates as a Wilkinson power divider for relatively high-frequency components of signals, and operates as a resistive divider for relatively low-frequency components of signals, allowing the circuit 400 to be used for broadband signals with reduced insertion loss as compared to using only a resistive divider. While the circuit 400 illustrates a single power divider circuit to facilitate understanding, multiple power dividers may be coupled together to split and/or combine signals. In certain aspects, the circuit 400 may be operable for broadband millimeter wave (mmWave) communications. For example, the circuit 400 may be implemented to provide or receive power to or from an array of antennas, which may be used for mmWave beamforming applications. For instance, the circuit 400 may be used to divide power received from a transmit path, and to provide the divided power to multiple antennas of the antenna array for transmission.

Figure 5A:
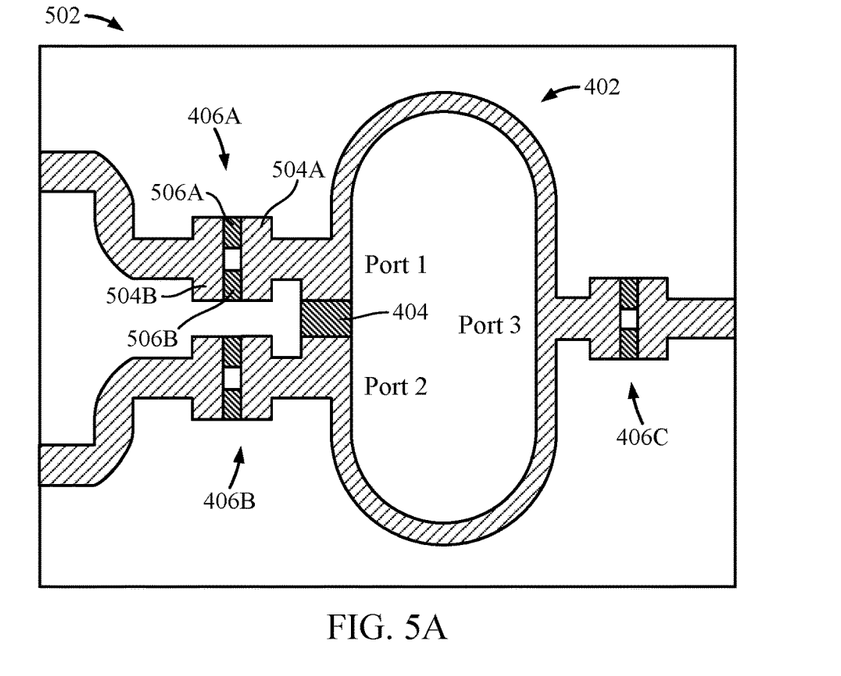
FIGS. 5A and 5B illustrate a printed circuit board (PCB) having a first layer and a second layer, in accordance with certain aspects of the present disclosure.
Figure 5B:
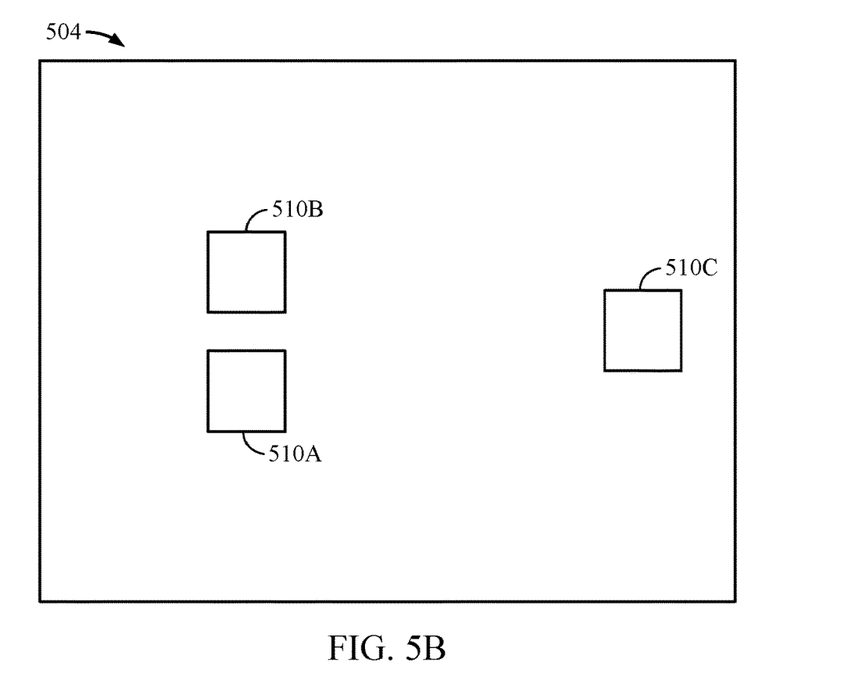

FIGS. 5A and 5B illustrate a circuit board having a first layer 502 and a second layer 504, in accordance with certain aspects of the present disclosure. As illustrated, a resistive element 506A (e.g., corresponding to resistive element 410A) and a capacitive element 506B (e.g., corresponding to capacitive element 412A) may be coupled between nodes 504A and 504B to create the RC circuit 406A. The RC circuits 406B and 406C may be implemented in a similar manner as illustrated.

The first, second, and third ports of the Wilkinson power divider 402 are coupled to the RC circuits 406, each having a ground cutout implemented adjacent thereto on the second layer 504 (e.g., electric ground layer) to reduce capacitive coupling to electric ground, that would otherwise reduce the RF performance of the broadband Wilkinson power divider described herein. For example, the second layer 504 may be an electric ground plane layer disposed beneath the first layer. The electric ground plane may be a sheet of electrically conductive material (e.g., metal). In certain aspects, the second layer 504 (e.g., the sheet of electrically conductive material) may have one or more cutouts 510A, 510B, and 510C (collectively referred to as "cutouts 510") placed below the RC circuits 406A, 406B, and 406C, respectively. By disposing the cutouts 510 below a respective one of the RC circuits 406, the parasitic capacitance between the RC circuits 406 and the electric ground plane may be reduced.

Figure 6:
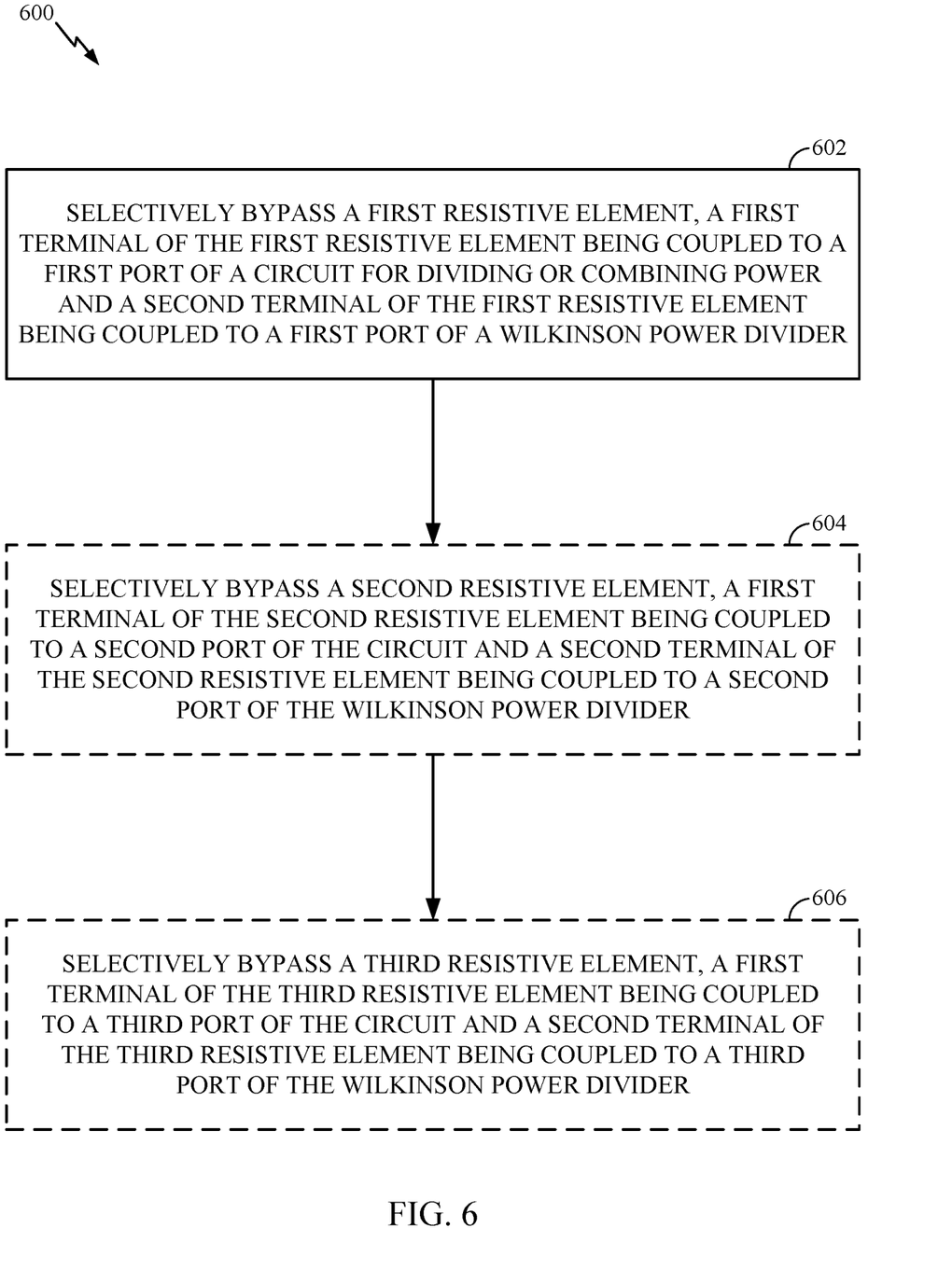
FIG. 6 is a flow diagram of example operations for dividing or combining power, in accordance with certain aspects of the present disclosure.

FIG. 6 is a flow diagram illustrating example operations 600 for dividing or combining power, in accordance with certain aspects of the present disclosure. The operations 600 may be performed by a circuit for dividing or combining power, such as the circuit 400 of FIG. 4.

The operations 600 begin, at block 602, by selectively bypassing a first resistive element (e.g., resistive element 410A), a first terminal of the first resistive element being coupled to a first port of the circuit for dividing or combining power and a second terminal of the first resistive element being coupled to a first port of a Wilkinson power divider (e.g., Wilkinson power divider 402). In certain aspects, the first resistive element is selectively bypassed based on a first frequency of a first signal at the first port of the circuit or the first port of the Wilkinson power divider.

In certain aspects, the operations 600 also include, at block 604, selectively bypassing a second resistive element (e.g., resistive element 410B). For example, a first terminal of the second resistive element may be coupled to a second port of the circuit and a second terminal of the second resistive element may be coupled to a second port of the Wilkinson power divider. In certain aspects, the second resistive element is selectively bypassed based on a second frequency of a second signal at the second port of the circuit or the second port of the Wilkinson power divider.

In certain aspects, the operations 600 also include, at block 606, selectively bypassing a third resistive element (e.g., resistive element 410C). For example, a first terminal of the third resistive element may be coupled to a third port of the circuit and a second terminal of the third resistive element may be coupled to a third port of the Wilkinson power divider. In certain aspects, the third resistive element is selectively bypassed based on a third frequency of a third signal at the third port of the circuit or the third port of the Wilkinson power divider.

In certain aspects, for a first frequency range of the signal, the first resistive element is not bypassed and the circuit is configured to operate as a resistive power divider. In certain aspects, for a second frequency range of the signal higher than the first frequency range, the first resistive element is bypassed and the circuit is configured to operate equivalent to the Wilkinson power divider. In certain aspects, the selectively bypassing configuring the circuit to operate as a resistive power divider for signal having frequencies in a first frequency range and to operate equivalent to the Wilkinson power divider without the resistive power divider for signal having frequencies in a second frequency range, the second frequency range higher than the first frequency range.

Figure 7:
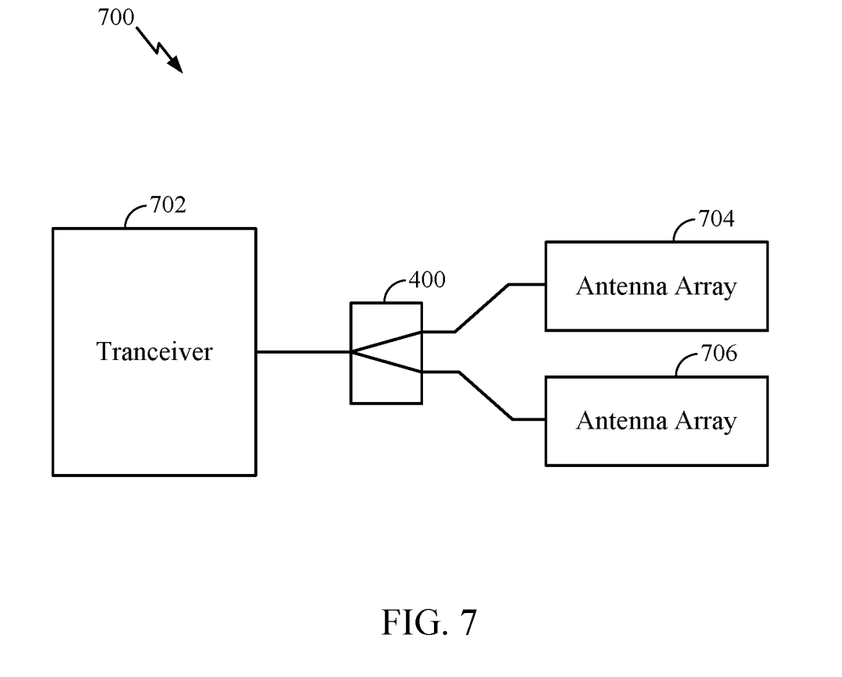
FIG. 7 is a block diagram of an example transceiver front end circuitry coupled to multiple antenna arrays, in accordance with certain aspects of the present disclosure.

FIG. 7 is a block diagram of an example transceiver front end circuitry 700 coupled to multiple antenna arrays 704 and 706, in accordance with certain aspects of the present disclosure. For example, the transceiver front end circuitry 700 includes a transceiver 702, which may include transmit and receive paths (e.g., the TX path 302 and the RX path 304 as described with respect to FIG. 3), which may be coupled to the antenna arrays 704 and 706 through the circuit 400 for dividing or combining power as described with respect to FIG. 4. For example, during reception, signals received from the antenna arrays 704 and 706 may be combined by the circuit 400. The combined signal generated by the circuit 400 may be provided to the receive path of the transceiver 702 for processing. In certain aspects, the circuit 400 may be part of the interface 306 as described with respect to FIG. 3, used to combine (or split) signals received (or to be transmitted) via multiple antennas.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for dividing or combining power, comprising:
    a Wilkinson power divider;
    a first resistive element having a first terminal coupled to a first port of the circuit and a second terminal coupled to a first port of the Wilkinson power divider; and
    a first bypass path coupled between the first terminal and the second terminal of the first resistive element and configured to selectively bypass the first resistive element, wherein the first resistive element and the first bypass path form a parallel circuit that is coupled between the first port of the circuit and the first port of the Wilkinson power divider, the circuit being configured to divide or combine a power of a first signal at the first port of the circuit.

2. The circuit of claim 1, wherein the first bypass path is configured to selectively bypass the first resistive element based on a first frequency of the first signal at the first port of the circuit or the first port of the Wilkinson power divider.

3. The circuit of claim 1, further comprising:
    a second resistive element having a first terminal coupled to a second port of the circuit and a second terminal coupled to a second port of the Wilkinson power divider; and
    a second bypass path coupled between the first terminal and the second terminal of the second resistive element and configured to selectively bypass the second resistive element.

4. The circuit of claim 3, wherein the second bypass path is configured to selectively bypass the second resistive element based on a second frequency of a second signal at the second port of the circuit or the second port of the Wilkinson power divider.

5. The circuit of claim 3, further comprising:
    a third resistive element having a first terminal coupled to a third port of the circuit and a second terminal coupled to a third port of the Wilkinson power divider; and
    a third bypass path coupled between the first terminal and the second terminal of the third resistive element and configured to selectively bypass the third resistive element.

6. The circuit of claim 5, wherein the third bypass path is configured to selectively bypass the third resistive element based on a third frequency of a third signal at the third port of the circuit or the third port of the Wilkinson power divider.

7. The circuit of claim 1, further comprising:
an impedance coupled between the first port and a second port of the Wilkinson power divider.

8. The circuit of claim 1, wherein the circuit is configured to operate as a resistive power divider for signals having frequencies in a first frequency range and to operate equivalent to the Wilkinson power divider without the resistive power divider for signals having frequencies in a second frequency range, the second frequency range being higher than the first frequency range.

9. The circuit of claim 1, further comprising:
a circuit board having a first layer and a second layer disposed beneath the first layer, wherein the first bypass path and the first resistive element are disposed adjacent the first layer, wherein the second layer comprises an electric ground plane layer, and wherein a cutout in the second layer is disposed beneath the first bypass path and the first resistive element.

10. The circuit of claim 1, wherein:
for a first range of frequencies, the first bypass path is configured to limit current flow between the first terminal and the second terminal of the first resistive element and the circuit is configured to operate as a resistive power divider; and
for a second range of frequencies higher than the first range of frequencies, the first bypass path is configured to allow current flow between the first terminal and the second terminal of the first resistive element and the circuit is configured to operate equivalent to the Wilkinson power divider.

11. The circuit of claim 10, wherein:
the first range of frequencies is less than 1.5 GHz; and
the second range of frequencies is greater than 8.4 GHz.

12. A wireless device comprising the circuit of claim 1, the wireless device further comprising:
at least two antennas; and
a transceiver, wherein the circuit is coupled between the at least two antennas and the transceiver.

13. A method for dividing or combining power, comprising:
selectively bypassing a first resistive element, a first terminal of the first resistive element being coupled to a first port of a circuit for dividing or combining power and a second terminal of the first resistive element being coupled to a first port of a Wilkinson power divider, wherein the first resistive element is coupled between the first port of the circuit and the first port of the Wilkinson power divider, the circuit being configured to divide or combine a power of a first signal at the first port of the circuit.

14. The method of claim 13, wherein the first resistive element is selectively bypassed based on a first frequency of the first signal at the first port of the circuit or the first port of the Wilkinson power divider.

15. The method of claim 13, further comprising:
selectively bypassing a second resistive element, a first terminal of the second resistive element being coupled to a second port of the circuit and a second terminal of the second resistive element being coupled to a second port of the Wilkinson power divider.

16. The method of claim 15, wherein the second resistive element is selectively bypassed based on a second frequency of a second signal at the second port of the circuit or the second port of the Wilkinson power divider.

17. The method of claim 15, further comprising:
selectively bypassing a third resistive element, a first terminal of the third resistive element being coupled to a third port of the circuit and a second terminal of the third resistive element being coupled to a third port of the Wilkinson power divider.

18. The method of claim 17, wherein the third resistive element is selectively bypassed based on a third frequency of a third signal at the third port of the circuit or the third port of the Wilkinson power divider.

19. The method of claim 13, wherein:
for a first range of frequencies, the first resistive element is not bypassed and the circuit is configured to operate as a resistive power divider; and
for a second range of frequencies higher than the first range of frequencies, the first resistive element is bypassed and the circuit is configured to operate equivalent to the Wilkinson power divider.

20. The method of claim 13, wherein the selectively bypassing comprises:
configuring the circuit to operate as a resistive power divider for signals having frequencies in a first frequency range and to operate equivalent to the Wilkinson power divider without the resistive power divider for signals having frequencies in a second frequency range, the second frequency range being higher than the first frequency range.

21. The method of claim 20, wherein:
the first frequency range is less than 1.5 GHz; and
the second frequency range is greater than 8.4 GHz.

* * * * *